(12) United States Patent
Mengad et al.

(10) Patent No.: US 9,960,741 B2
(45) Date of Patent: May 1, 2018

(54) HIGH FREQUENCY COMMON MODE REJECTION TECHNIQUE FOR LARGE DYNAMIC COMMON MODE SIGNALS

(71) Applicant: Dialog Semiconductor (UK) Limited, London (GB)

(72) Inventors: Zakaria Mengad, Edinburgh (GB); Vladislav Vasilev, Edinburgh (GB); Steven Collins, Dalkeith (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days. days.

(21) Appl. No.: 15/193,420

(22) Filed: Jun. 27, 2016

(65) Prior Publication Data

US 2017/0373655 A1 Dec. 28, 2017

(51) Int. Cl.
*H03F 3/45* (2006.01)
*H03F 3/185* (2006.01)
*H03F 3/217* (2006.01)

(52) U.S. Cl.
CPC ......... *H03F 3/45932* (2013.01); *H03F 3/185* (2013.01); *H03F 3/2173* (2013.01); *H03F 2200/171* (2013.01); *H03F 2200/351* (2013.01); *H03F 2200/462* (2013.01); *H03F 2200/481* (2013.01)

(58) Field of Classification Search
None
See application file for complete search history.

(56) References Cited

U.S. PATENT DOCUMENTS

| | | | |
|---|---|---|---|
| 6,956,727 B1 | 10/2005 | Brokaw | |
| 7,477,082 B2 | 1/2009 | Fukazawa | |
| 2003/0072462 A1* | 4/2003 | Hlibowicki | H04R 3/007 381/96 |
| 2004/0000955 A1* | 1/2004 | Wang | H03F 3/45188 330/301 |
| 2010/0060200 A1* | 3/2010 | Newman, Jr. | H05B 41/2822 315/307 |

(Continued)

FOREIGN PATENT DOCUMENTS

| | | |
|---|---|---|
| WO | WO03098788 | 11/2003 |
| WO | WO 2015/113003 | 7/2015 |

OTHER PUBLICATIONS

German Office Action, File No. 10 2016 216 576.3, Applicant: Dialog Semiconductor (UK) Limited, dated Jun. 26, 2017, 11 pgs, and English language translation, 11 pgs.

*Primary Examiner* — Curtis Kuntz
*Assistant Examiner* — Qin Zhu
(74) *Attorney, Agent, or Firm* — Saile Ackerman LLC; Stephen B. Ackerman

(57) ABSTRACT

A system is disclosed which allows for canceling high frequency rail to rail common mode swing at pulse-width modulation (PWM) frequency for a Class-D, H and G audio amplifier or a Linear Resonance Actuator (LRA) driver. This allows wide bandwidth current sensing without the need of external components, or large on-chip resistor-capacitor (RC) networks, facilitating integration of the sense resistor. In addition, the sense amplifier DC input common mode and audio band common mode swing is reduced, allowing a sense resistor high frequency common mode swing of a least twice the MOSFET gate break down voltages.

19 Claims, 16 Drawing Sheets

(56) References Cited

U.S. PATENT DOCUMENTS

| | | | |
|---|---|---|---|
| 2011/0193481 A1* | 8/2011 | Nakamura | H05B 41/2882 315/82 |
| 2012/0229264 A1* | 9/2012 | Company Bosch | G06F 3/016 340/407.1 |
| 2013/0223652 A1* | 8/2013 | Sahandiesfanjani | H03F 1/30 381/121 |
| 2013/0249616 A1 | 9/2013 | Priel et al. | |
| 2013/0265035 A1 | 10/2013 | Mazzarella et al. | |
| 2014/0177850 A1 | 6/2014 | Quan et al. | |
| 2015/0077182 A1* | 3/2015 | Taylor | H03K 19/01852 330/253 |
| 2016/0360317 A1* | 12/2016 | Lee | H04R 3/12 |

* cited by examiner

HIGH FREQUENCY COMMON MODE REJECTION TECHNIQUE FOR LARGE DYNAMIC COMMON MODE SIGNALS

BACKGROUND

Field

The disclosure relates generally to Class-D, H and G amplifiers and Linear Resonance Actuator (LRA) drivers, monitoring output current and determining load impedance.

Description of Related Art

Class-D, H and G audio amplifiers and Linear Resonance Actuator (LRA) drivers have a growing need to monitor their output current, allowing them to determine their load impedance for functions such as speaker protection and resonant frequency searching on LRAs.

FIG. 1 illustrates current sensing circuit 100 for a Class-D amplifier, of the prior art. One method of monitoring the current is to put a small resistor 115, external or internal to the chip, in series with load 120, and monitor the differential voltage across the small resistor 115. This results in a high frequency common mode swing, typically 1V/ns to 5V/ns, from 0V to the Class-D/LRA driver supply voltage, which is much larger than the differential signal being detected. The Rsense resistor is typically of the order of 100 mΩ, to minimize its effect on the efficiency of the Class-D amplifier. The differenitial voltage across the Rsense resistor is then amplified by the circuitry, comprised of input conditioner 135, antialiasing filter 140, and an analog to digital converter 145. Thus, for a typical 8Ω load at the Class-D output 105, 110, 125, and 130, and 1 A peak current with 10V supply rails, the voltage sensed across the resistor will be 100 mV at its peak, while the common mode swing will be 100 times larger.

FIG. 2 shows Class-D H Bridge states 200, demonstrating typical tertiary modulation, of the prior art. The common mode swing on the input differential signal across the sense resistor can be seen in different Class-D H-bridge states. States 1 and 2 result in a common mode of supply, while states 3 and 4 result in a common mode of ground. State 1 common mode supply is comprised of high side devices 205 and 225, low side devices 210 and 230, sense resistor 286, and inductive load 296. High side device 205 and low side device 230 are on for state 1. State 2 common mode supply is comprised of high side devices 245 and 265, low side devices 250 and 270, sense resistor 288, and inductive load 298. High side devices 245 and 265 are on for state 2. State 3 common mode ground is comprised of high side devices 215 and 235, low side devices 220 and 240, sense resistor 287, and inductive load 297. High side device 235 and low side device 220 are on for state 3. State 4 common mode ground is comprised of high side devices 255 and 275, low side devices 260 and 280, sense resistor 289, and inductive load 299. Low side devices 260 and 280 are on for state 4. Hence, the common mode switches between supply and ground, at the pulse-width modulation (PWM) frequency, which is typically several hundred kHz. Note a similar effect is also seen with a binary modulation scheme for states 1 and 3.

This level of common mode swing would require very heavy common mode filtering for a continuous time circuit implementation, which in turn would result in large area and power requirements and/or reduction of the bandwidth that could be sensed. The rail-to-rail common mode swing would need a rail-to-rail amplifier, where the rails are potentially 10V or more apart. This would result in a number of disadvantages, including high complexity, higher distortion, different offset for the N and P based input pairs making offset trim very hard, high temperature drift of the offset, and very high bandwidth and stewing requirements. Additionally, if the supplies to the Class-D amplifier are high enough, the high voltage common mode swing of the amplifier inputs require higher than the typical gate breakdown.

Another widely used method of monitoring current through the load connected to the H-bridge involves either a low or high side H-bridge sense resistor configuration. This has the advantage of limiting the absolute common mode and common mode swing to several hundred millivolts as the sense resistor is usually of the order of 100 mΩ and stays at ground or supply.

FIG. 3 illustrates low-side sense resistor current sensing 300, of the prior art. Class-D H bridge 310 is comprised of high side devices 320 and 325, their gates the outputs of buffers 311 and 313 respectively, low side devices 321 and 326, their gates the outputs of buffers 312 and 314 respectively, and sense resistors 322 and 324, at the sources of the low side devices. Inductive load 323 is connected across the outputs of the Class-D amplifier, the drain of the high and low side devices 325 and 326, and node LA. Low pass summing amplifier 350 is comprised of resistor Ra 355, capacitor C1 365, and resistor Rf 385 at V1, and resistor Rc 375. Resistor Rc 375 and capacitor C2 396 are the positive input of differential amplifier 395. The low pass summing amplifier is also comprised of resistor Ra 360, capacitor C1 370, and resistor Rfb 390 at V2, and resistor Rc 380. Resistor Rc 380, and capacitor C2 397 are the negative input of differential amplifier 395. Amplifier 395 then supplies an analog-to-digital converter (ADC) or antialiasing filter (AAF), with the common mode voltage.

However, this method has disadvantages. Resistors on the sources of the low side are difficult to implement and match, and any mismatch will result in distortion that is too high for high-end applications. Resistor area can be about twice that of a single resistor solution, as two discrete resistors need to be placed.

SUMMARY

An object of the disclosure is to implement continuous current monitoring by means of a single sense resistor in series with a Class-D, H or G audio amplifier, or a Linear Resonance Actuator (LRA) driver, while minimizing filtering requirements, and cancelling the large swing common mode signal with an anti-phase signal.

Further, another object of this disclosure is to allow wide band current sensing without the need of external components or large on-chip resistor-capacitor (RC) networks, facilitating integration of the sense resistor on-chip.

Still, another object of this disclosure is to reduce the sense amplifier DC input common mode and audio band common mode, allowing a sense resistor high frequency common mode swing.

To accomplish the above and other objects, a high frequency common mode rejection technique for large dynamic common mode signals is disclosed, comprised of a sense resistor in series with a Class-D, H or G amplifier, or linear resonance actuator (LRA) driver load. The high frequency common mode rejection technique requires a fast high voltage (HV) inverter, a summing amplifier, and a low pass filter.

The above and other objects are further achieved by a method for high frequency common mode rejection for large common mode signals. The steps include cancelling high frequency rail-to-rail common mode swing at pulse-width modulation (PWM) frequency. Allowing of wide bandwidth current sensing without the need of external components or large on-chip resistor-capacitor (RC) networks, is provided. Reducing the sense amplifier DC input common mode and audio band common mode swing, is provided. Allowing a sense resistor high frequency common mode swing, with continuous current monitoring, is provided.

In various embodiments, the function may be achieved by implementing a high frequency common mode cancellation circuit, with second order filtering.

In various embodiments, the function may be achieved by implementing a chopper, which may be used to reduce the effects of mismatch in the inverter-connected resistors.

In various embodiments, the function may be achieved by implementing a high voltage (HV) inverter with buffered and delayed control signals.

In various embodiments, the function may be achieved where the common mode behaves like a Class D amplifier output.

DETAILED DESCRIPTION

The disclosed circuit can be used to cancel large high frequency common mode swing of an input containing an extremely small differential signal, such as detecting the current of Class-D, H and G amplifiers, and for a linear resonance actuator (LRA) driver. The need for the circuit is higher at higher supply voltages, such as the Class-D amplifier, where the supply voltage can be 8V and above.

Figure 1:
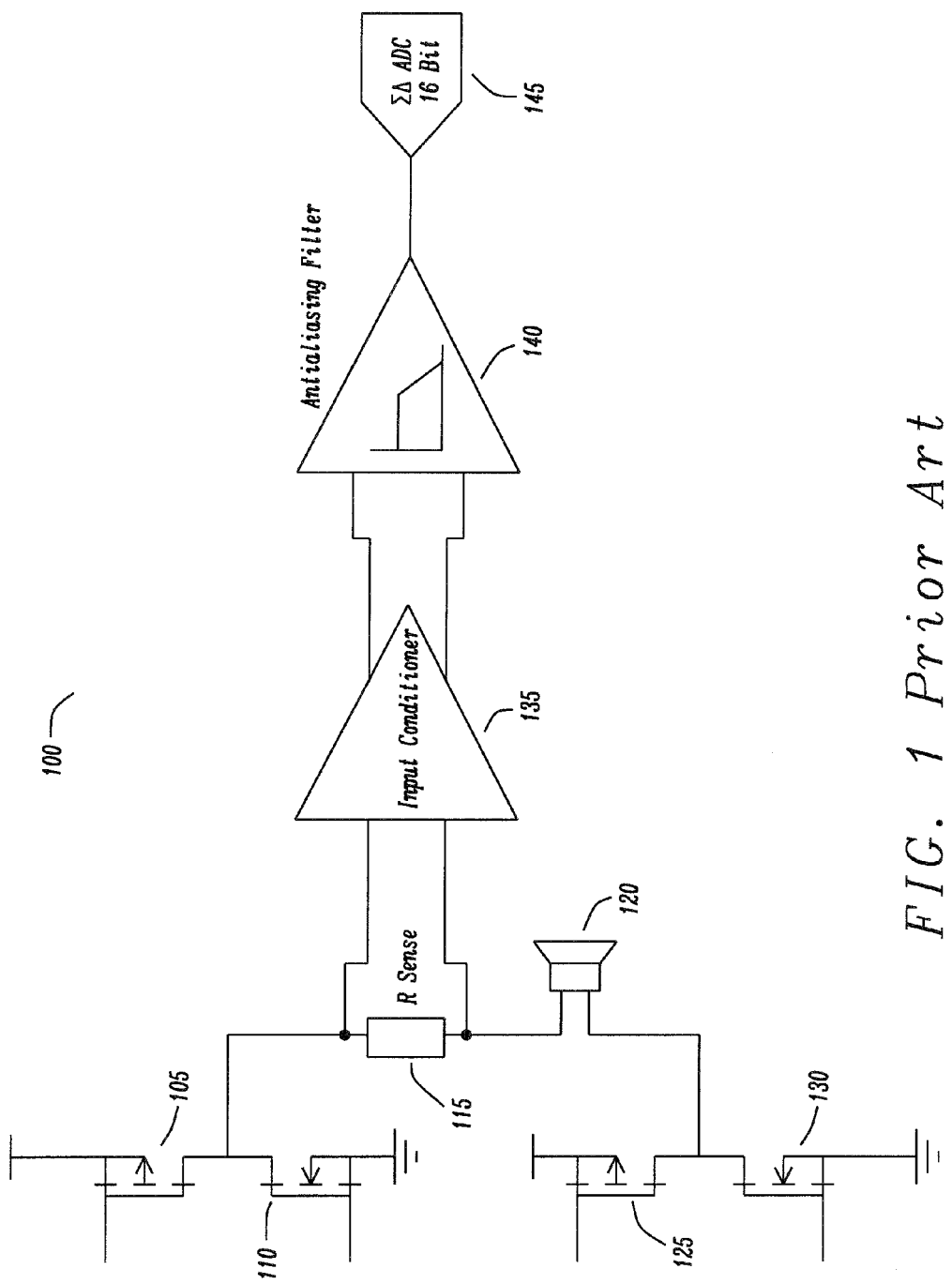
FIG. 1 illustrates current sensing circuit for a Class-D amplifier, of the prior art.
Figure 2:
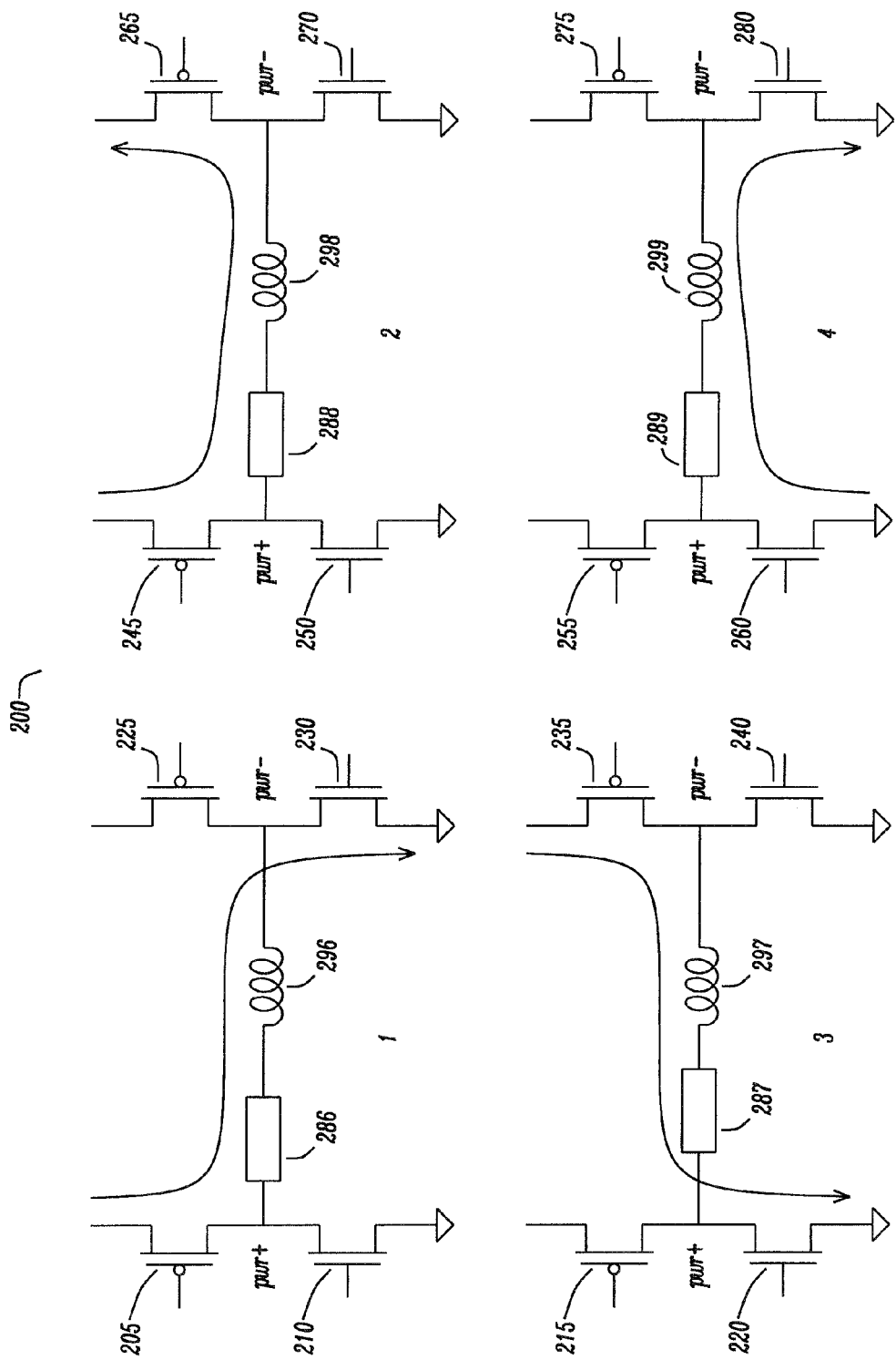
FIG. 2 shows Class-D H Bridge states, demonstrating typical tertiary modulation, of the prior art.
Figure 3:
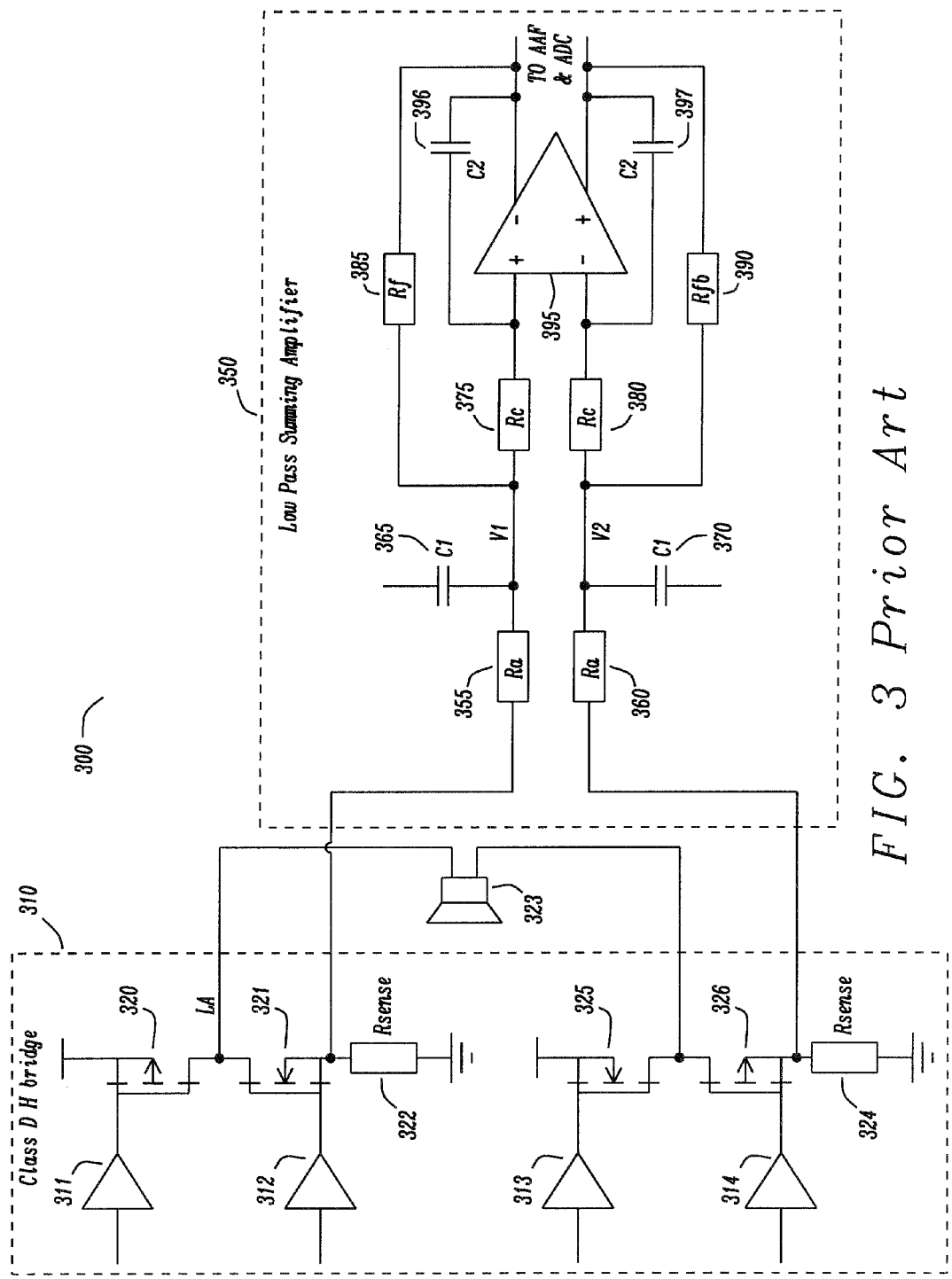
FIG. 3 illustrates low-side sense resistor current sensing, of the prior art.
Figure 4:
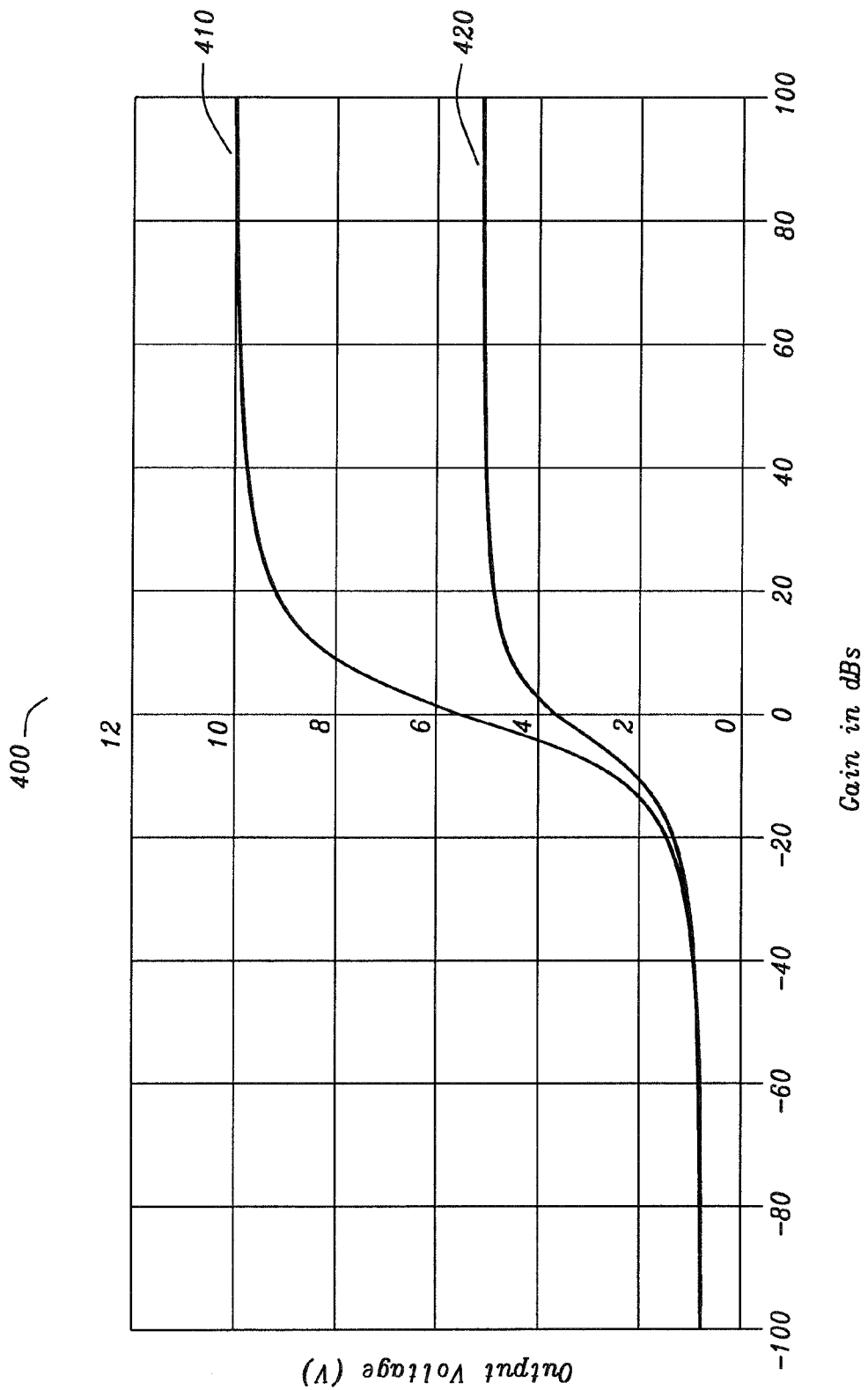
FIG. 4 shows a comparison of the common mode voltage, with and without a high voltage (HV) inverter, embodying the principles of the disclosure.

FIG. 4 shows comparison of the common mode output voltage 400, with and without a high voltage (HV) inverter, embodying the principles of the disclosure. The HV inverter is applied between the drains of the high and low side devices of the Class-D H bridge and the inputs to a low pass summing amplifier. The effect of gain on the common mode, for a 10V source common mode and a 0.72V output common mode is shown. It is shown that the gain is decreased by nearly half, with the fast HV inverter of the disclosure in 420, compared to without the fast HV inverter in 410, where the fast HV inverter switches in less than 5 ns from detection to output.

Figure 5A:
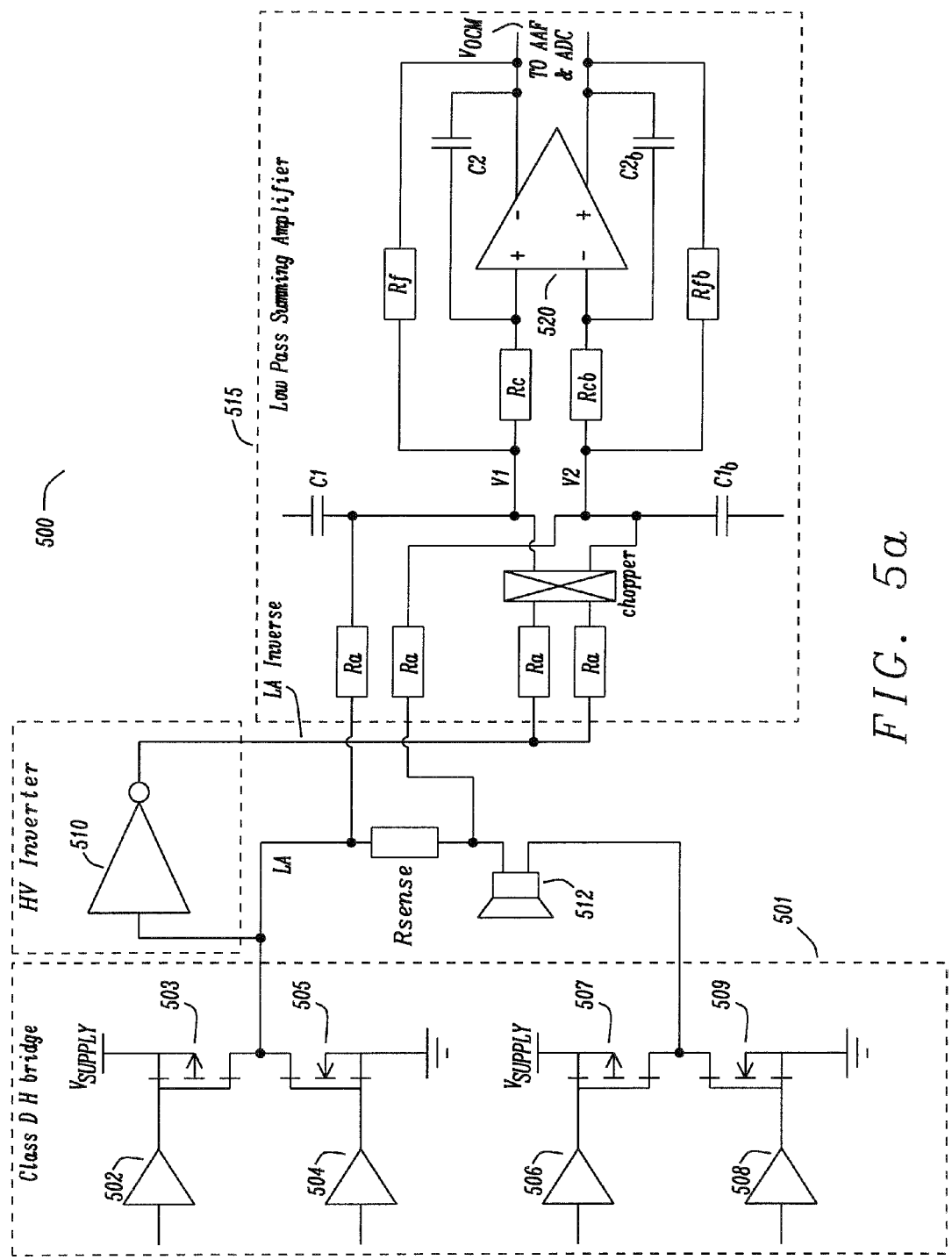
FIG. 5a illustrates a high frequency common mode cancellation circuit with a Class-D amplifier and second order filtering, embodying the principles of the disclosure.

FIG. 5a illustrates a high frequency common mode cancellation circuit 500 with a Class-D amplifier and second order filtering, embodying the principles of the disclosure. It shows the output stage of Class-D H bridge 501, and sense resistor Rsense, used to convert the current into a differential voltage. Class-D H bridge 501 is comprised of high side devices 503 and 507, their gates the outputs of buffers 502 and 506 respectively, and low side devices 505 and 509, their gates the outputs of buffers 504 and 508 respectively. The sense resistor is now across the drains of high side device 503 and low side device 505 at node LA, and the input to Class-D amplifier 512. The drains of high side device 507 and low side device 509 are also input to inductive load (speaker) 512. In various embodiments, the function may be achieved implementing a PMOS high side device and an NMOS low side device. In various embodiments, the function may be achieved implementing a NMOS high side device and an NMOS low side device. In various embodiments, the high side and low side devices may be achieved by implementing bipolar transistors.

High frequency common mode cancellation circuit 500 is further comprised of high voltage (HV) inverter 510 and low pass summing amplifier 515, with second order low pass filtering. While second order low pass filtering is illustrated, first order low pass filtering may be sufficient. The circuit also shows an optional chopper, which may be used to reduce the effects of mismatch in the inverter-connected resistors.

Low pass summing amplifier 515 is further comprised of four resistors Ra and two resistors Rf and Rfb: first resistor Ra across node LA and V1, with capacitor C1 and resistor Rf; second resistor Ra across Rsense at the input to the inductive load (speaker), and V2, with capacitor C1b and Rfb; third and fourth resistors Ra across HV inverter 510 output and the chopper. V1 across resistor Rc and capacitor C2 is the positive input of differential amplifier 520. V2 across resistor RCb, and capacitor C2b is the negative input of differential amplifier 520. Amplifier 520 supplies an analog-to-digital converter (ADC) or antialiasing filter (AAF), with common mode voltage Vocm.

The nominal common mode voltage of V1 and V2 for an amplifier output common mode voltage of Vocm is:

$$V1=(AdV\text{supply}+V\text{ocm})/(2Ad+1), \text{ where } Ad=Rf/Ra$$

compared to the following common mode voltage without the inverter:

$$V1=(AdV\text{supply}+V\text{ocm})/(Ad+1)$$

| Condition | With HV inverter | Without HV inverter |
|---|---|---|
| $A_d \gg 1$ | $V_{supply}/2$ | $V_{supply}$ |
| $A_d \ll 1$ | $V_{ocm}$ | $V_{ocm}$ |

When node LA is at ground, the common mode voltage of the sense resistor is:

$$(I R\text{sense})/2$$

The fast HV inverter detects that node LA is at ground, and produces LA_inverse signal at the level of Class-D Vsupply. V1 and V2 have a nominal common mode voltage with a supply of:

$$(V\text{supply}-(I R\text{sense})/2)$$

With node LA at Vsupply, LA_inverse is at ground, and the common mode voltage of the sense resistor is:

$$(V\text{supply}-(I R\text{sense})/2)$$

And V1 and V2 have a nominal common mode voltage with a supply of:

$$(V\text{supply}-(I R\text{sense})/2)$$

Therefore, the common mode of V1 and V2 is independent of the pulse-width modulation (PWM) frequency or modulation depth. Note however the common mode is not independent of the input differential voltage or varying supply voltage.

The output common mode voltage swing becomes limited to:

$$V\text{out\_amplifier}/(2A_d+1)$$

where Vout_amplifier is the maximum output voltage swing of amplifier 520.

Note, in practical implementation, the circuit requires at least a first order common mode filter in the form of C1 and Ra, to reduce the high frequency ripple that is produced by the propagation delay of the high frequency HV inverter.

Figure 5B:
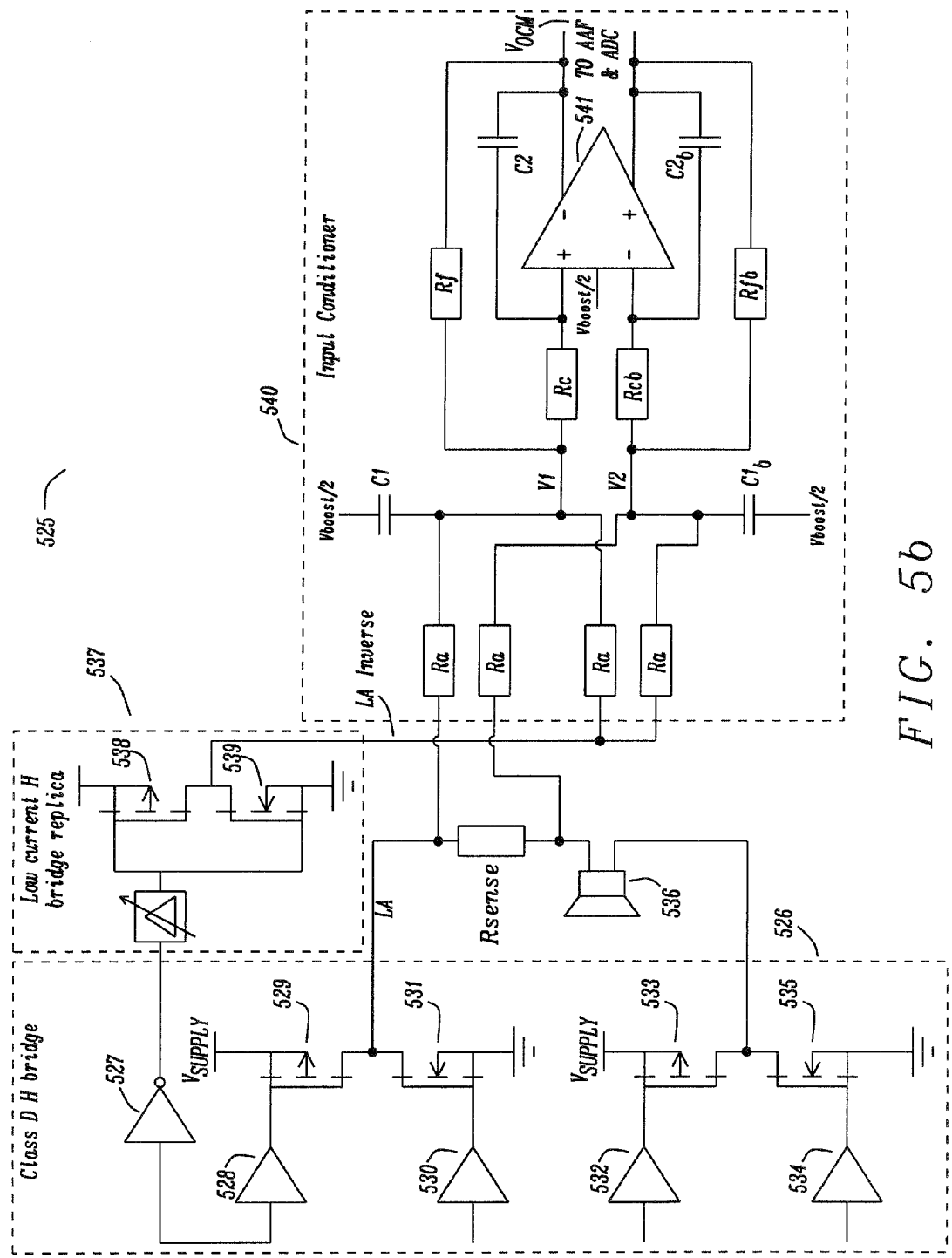
FIG. 5b illustrates an additional realization of the high voltage (HV) inverter with a Class-D amplifier, with buffered and delayed control signals, embodying the principles of the disclosure.

FIG. 5b illustrates an additional realization of high voltage (HV) inverter 525 with a Class-D amplifier, with buffered and delayed control signals, embodying the principles of the disclosure. It shows the output stage of Class-D H bridge 526, and sense resistor Rsense, used to convert the current into a differential voltage. Class-D H bridge 526 is comprised of high side devices 529 and 533, their gates the outputs of buffers 528 and 532 respectively, and low side devices 531 and 535, their gates the outputs of buffers 530 and 534 respectively. The sense resistor is now across the drains of high side device 529 and low side device 531 at node LA, and the input to inductive load (speaker) 536. The drains of high side device 533 and low side device 535 are also input to inductive load (speaker) 536. In various embodiments, the function may be achieved implementing a PMOS high side device and an NMOS low side device. In various embodiments, the function may be achieved implementing a NMOS high side device and an NMOS low side device. In various embodiments, the high side and low side devices may be achieved by implementing bipolar transistors.

High frequency common mode cancellation circuit 525 is further comprised of low current H bridge replica 537 and low pass summing amplifier 540, with second order low pass filtering. While second order low pass filtering is illustrated, first order low pass filtering may be sufficient.

Low current H bridge replica 537, an HV inverter driven from a different source, is further comprised of delayed control signals through inverter 527, high side device 538 and low side device 539. The drains of the high side and low side device comprise the output of the low current H bridge replica.

Low pass summing amplifier 540 is further comprised of four resistors Ra and two resistors Rf and Rfb: first resistor Ra across node LA and V1, with capacitor C1 and resistor Rf; second resistor Ra across Rsense at the input to the Class-D amplifier, and V2 with capacitor C1b and Rfb; third resistor Ra across low current H bridge replica 537 output and V1; fourth resistor Ra across low current H bridge replica 537 output and V2. V1 across resistor Rc and capacitor C2 is the positive input of differential amplifier 541. V2 across resistor Rcb, and capacitor C2b is the negative input of differential amplifier 541. Amplifier 541 supplies an analog-to-digital converter (ADC) or antialiasing filter (AAF), with common mode voltage Vocm.

Figure 5C:
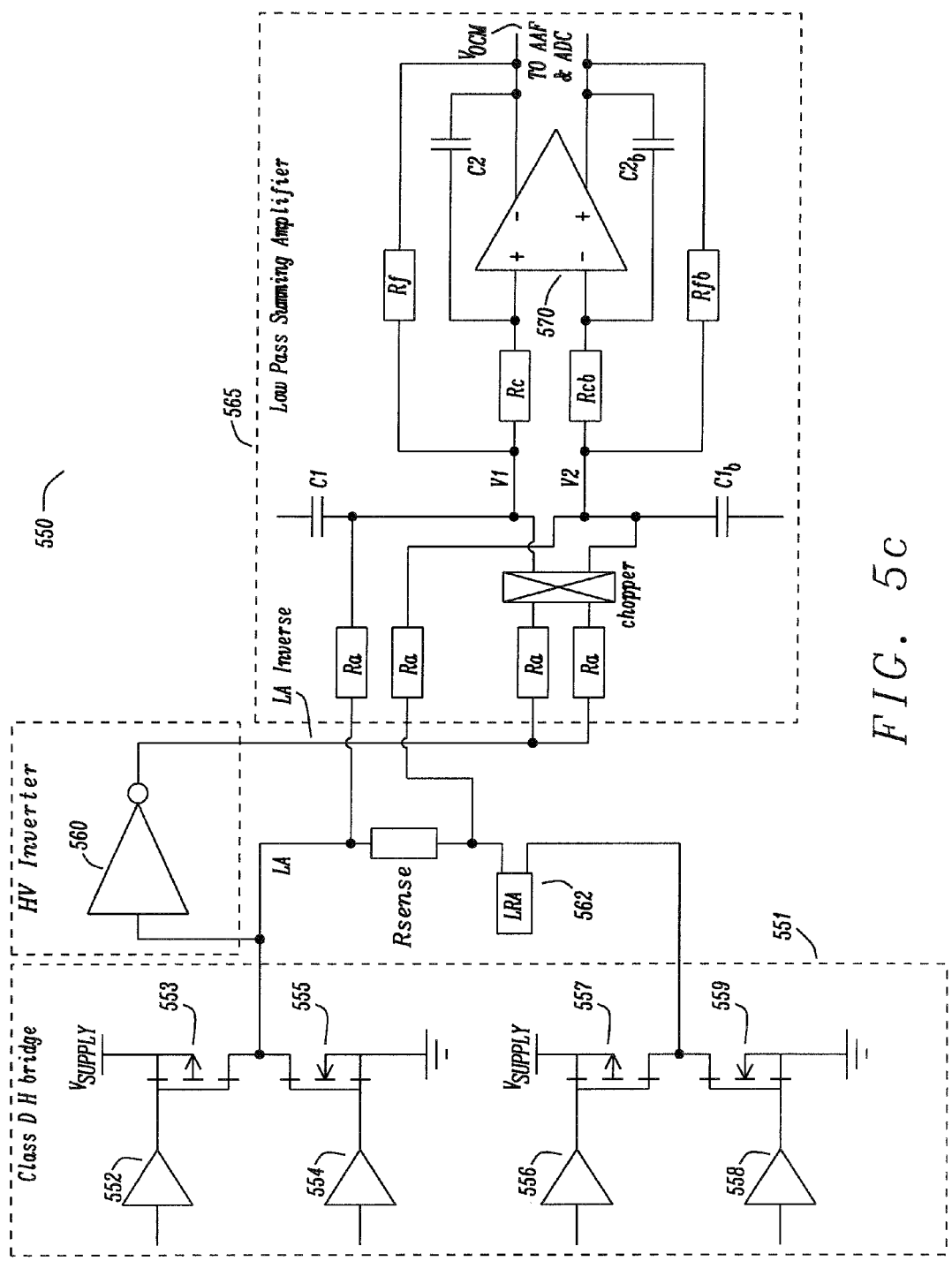
FIG. 5c illustrates a high frequency common mode cancellation circuit, with a linear resonance actuator (LRA) driver and second order filtering, embodying the principles of the disclosure.

FIG. 5c illustrates high frequency common mode cancellation circuit 550, with a linear resonance actuator (LRA) driver and second order filtering, embodying the principles of the disclosure. It shows the output stage of Class-D H bridge 551, and sense resistor Rsense, used to convert the current into a differential voltage. Class-D H bridge 551 is comprised of high side devices 553 and 557, their gates the outputs of buffers 552 and 556 respectively, and low side devices 555 and 559, their gates the outputs of buffers 554 and 558 respectively. The sense resistor is now across the drains of high side device 553 and low side device 555 at node LA, and the input to LRA 562. The drains of high side device 557 and low side device 559 are also input to LRA 562. In various embodiments, the function may be achieved implementing a PMOS high side device and an NMOS low side device. In various embodiments, the function may be achieved implementing a NMOS high side device and an NMOS low side device. In various embodiments, the high side and low side devices may be achieved by implementing bipolar transistors.

High frequency common mode cancellation circuit 550 is further comprised of high voltage (HV) inverter 560 and low pass summing amplifier 565, with second order low pass filtering. While second order low pass filtering is illustrated, first order low pass filtering may be sufficient. The circuit also shows an optional chopper, which may be used to reduce the effects of mismatch in the inverter-connected resistors.

Low pass summing amplifier 565 is further comprised of four resistors Ra and two resistors Rf and Rfb: first resistor Ra across node LA and V1, with capacitor C1 and resistor Rf; second resistor Ra across Rsense at the input of the LRA, and V2 with capacitor C1b and Rfb; third and fourth resistors RA across HV inverter 560 output and the chopper. V1 across resistor Rc and capacitor C2 is the positive input of differential amplifier 570. V2 across resistor Rcb, and capacitor C2b is the negative input of differential amplifier

570. Amplifier 570 supplies an analog-to-digital converter (ADC) or antialiasing filter (AAF), with common mode voltage Vocm.

Figure 5D:
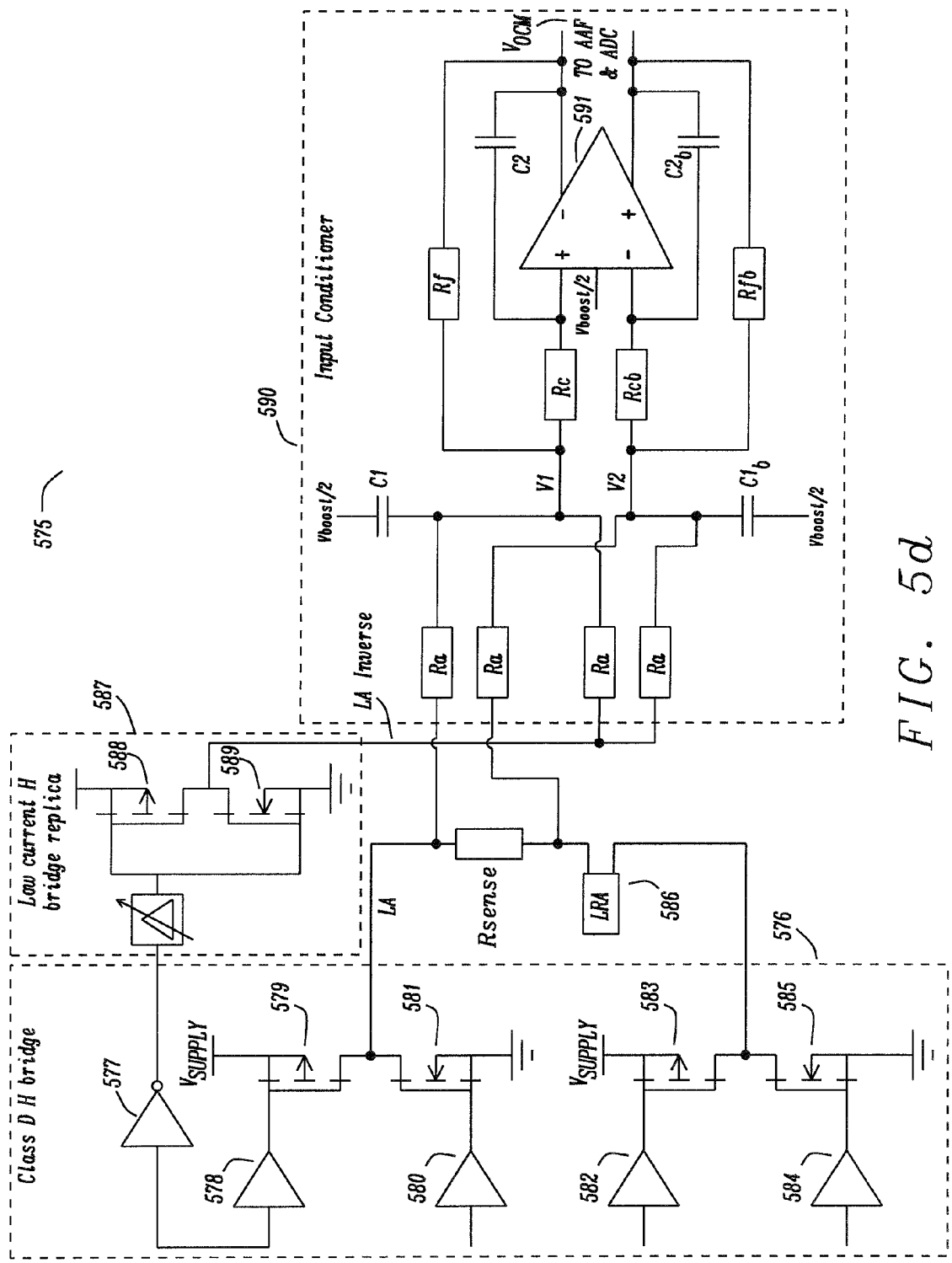
FIG. 5d illustrates an additional realization of the high voltage (HV) inverter, with a linear resonance actuator (LRA) driver, and buffered and delayed control signals, embodying the principles of the disclosure.

FIG. 5d illustrates an additional realization of high voltage (HV) inverter 575, with a linear resonance actuator (LRA) driver, and buffered and delayed control signals, embodying the principles of the disclosure. It shows the output stage of Class-D H bridge 576, and sense resistor Rsense, used to convert the current into a differential voltage. Class-D H bridge 576 is comprised of high side devices 579 and 583, their gates the outputs of buffers 578 and 582 respectively, and low side devices 581 and 585, their gates the outputs of buffers 580 and 584 respectively. The sense resistor is now across the drains of high side device 579 and low side device 581 at node LA, and the input to LRA 586. The drains of high side device 583 and low side device 585 are also input to LRA 586. In various embodiments, the function may be achieved implementing a PMOS high side device and an NMOS low side device. In various embodiments, the function may be achieved implementing a NMOS high side device and an NMOS low side device. In various embodiments, the high side and low side devices may be achieved by implementing bipolar transistors.

High frequency common mode cancellation circuit 575 is further comprised of low current H bridge replica 587 and low pass summing amplifier 590, with second order low pass filtering. While second order low pass filtering is illustrated, first order low pass filtering may be sufficient.

Low current H bridge replica 587 is further comprised of delayed control signals through inverter 577, high side device 588 and low side device 589. The drains of the high side and low side device comprise the output of the low current H bridge replica.

Low pass summing amplifier 590 is further comprised of four resistors Ra and two resistors Rf and Rfb: first resistor Ra across node LA and V1, with capacitor C1 and resistor Rf; second resistor Ra across Rsense at the input to the LRA, and V2 with capacitor C1b and Rfb; third resistor Ra across low current H bridge replica 587 output and V1; fourth resistor Ra across low current H bridge replica 587 output and V2. V1 across the resistor Rc and capacitor C2 is the positive input of differential amplifier 591. V2 across resistor Rcb and capacitor C2b is the negative input of differential amplifier 591. Amplifier 591 supplies an analog-to-digital converter (ADC) or antialiasing filter (AAF) with common mode voltage Vocm.

Figure 6:
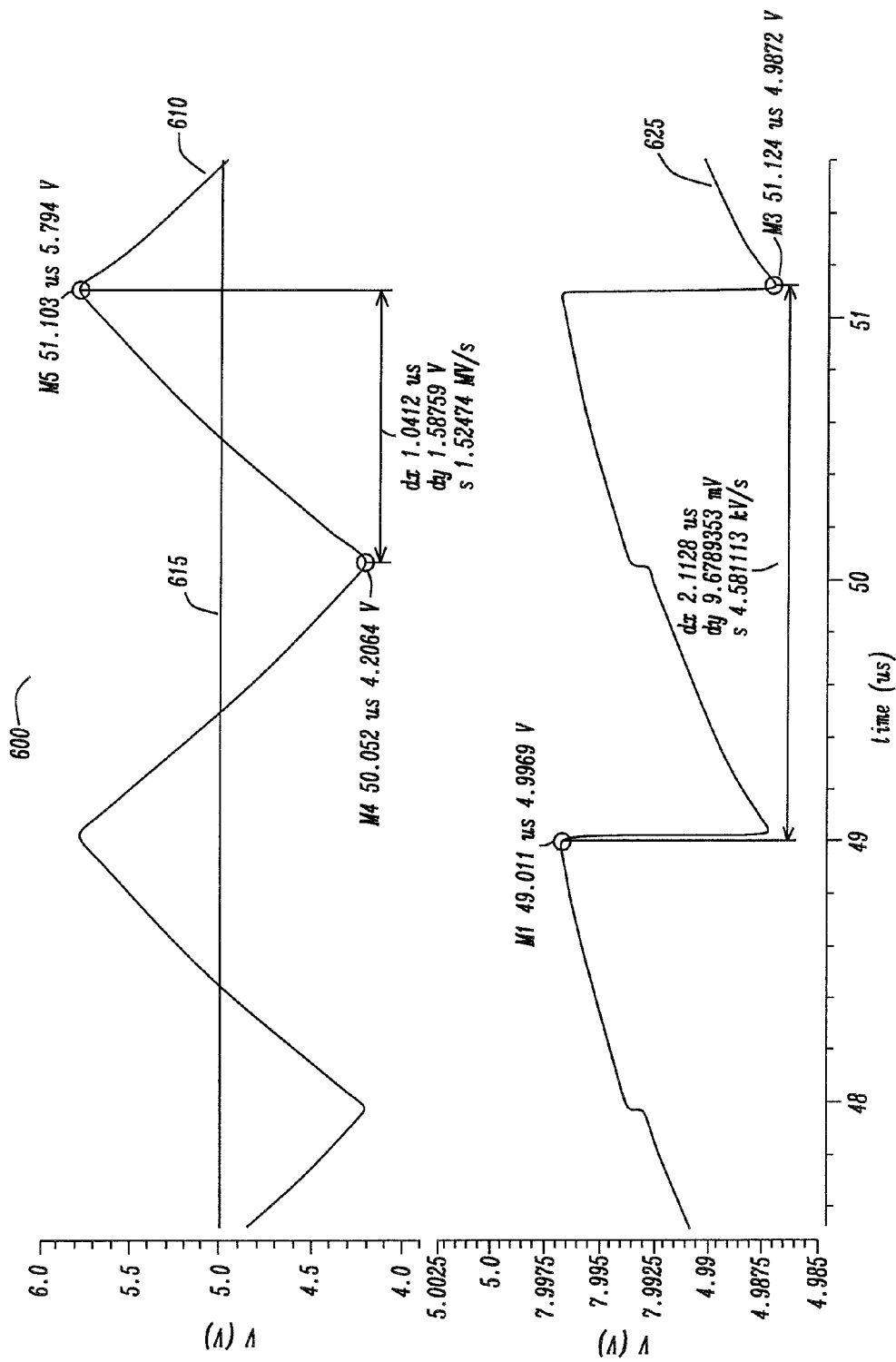
FIG. 6 shows common mode swing with and without the effect of the high voltage (HV) inverter, embodying the principles of the disclosure.

FIG. 6 shows common mode swing 600 with and without the effect of the high voltage (HV) inverter, embodying the principles of the disclosure. The common mode swing without the HV inverter enabled is shown in 610, compared to the common mode swing with the HV inverter enabled 615. Note the pulse-width modulation (PWM) induced ripple is attenuated significantly, by 44 dB, with the HV inverter enabled. This can be seen in 625, a magnified version of the HV inverter enabled. The HV inverter is simulated at the transistor level, with the printed circuit board (PCB) parasitics included.

Figure 7:
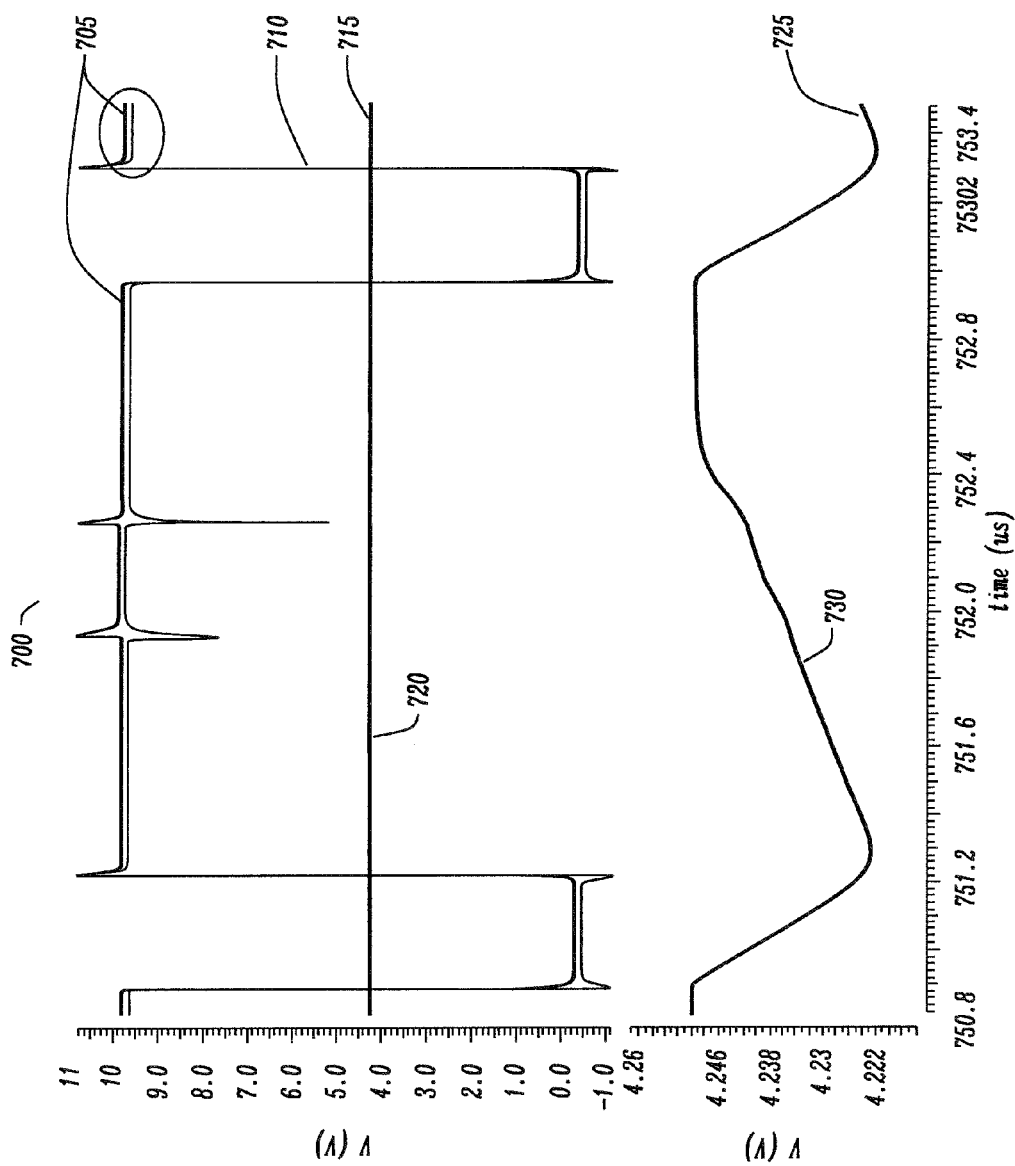
FIG. 7 illustrates the common mode swing against the sensed signal across the resistor, from the output current of a Class-D amplifier, embodying the principles of the disclosure.

FIG. 7 illustrates common mode swing 700 against the sensed signal across the resistor, from the output current of a Class-D amplifier, embodying the principles of the disclosure. At an output current of 1.5 A, negative V2 715 and positive V1 720 inputs to the amplifier are shown, with respect to the voltage at both ends of sensing resistor Rsense. Waveform 705 represents node LA, and 710 the input to the audio amplifier. Magnified waveforms V2 725 and V1 730 show the differential swing is significantly attenuated with the HV inverter enabled, and that the differential voltage sensed is very small compared to the peak-to-peak common mode signal.

Figure 8:
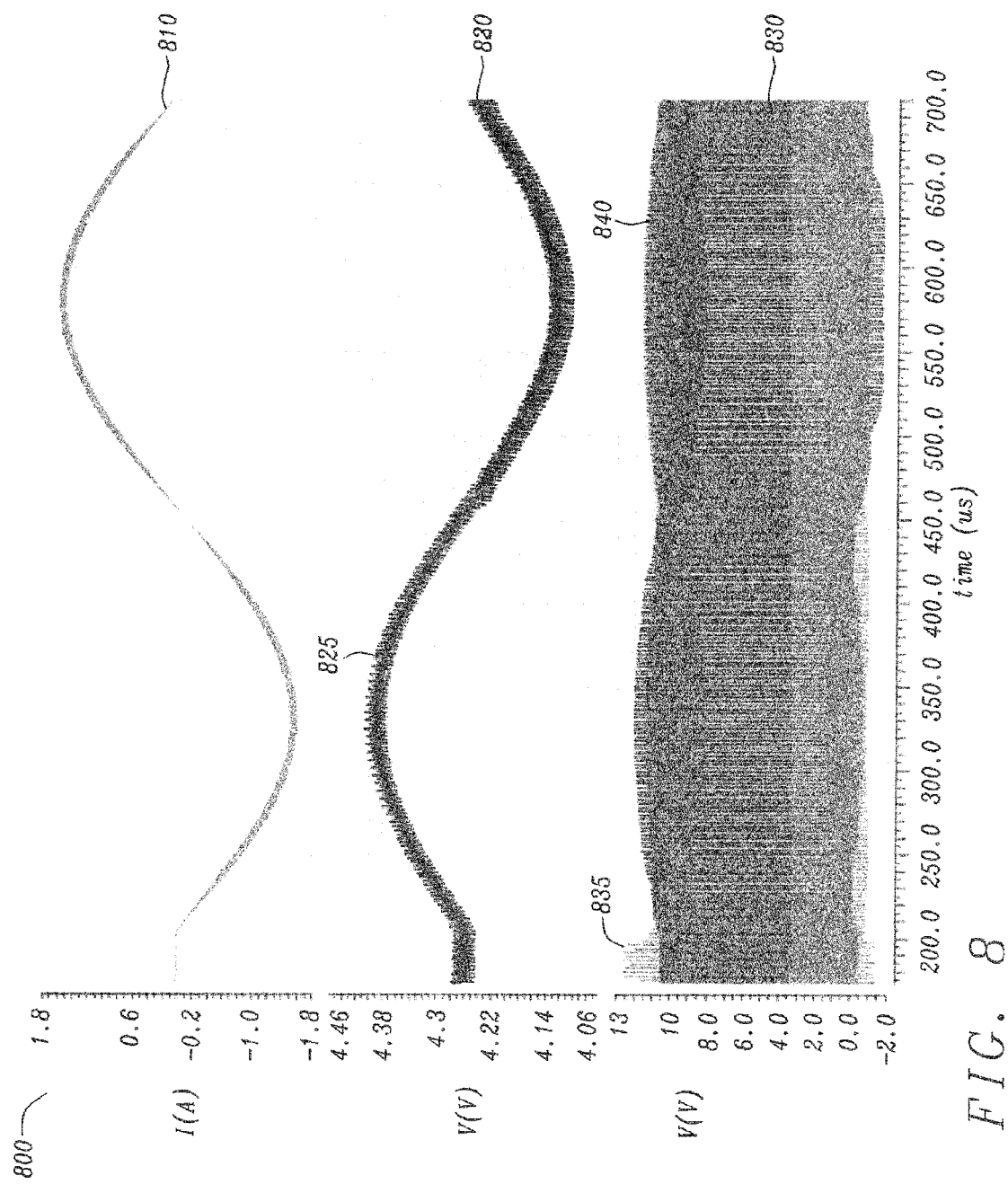
FIG. 8 shows circuit operation over a full sine wave cycle from a Class-D amplifier, embodying the principles of the disclosure.

FIG. 8 shows circuit operation 800 over a full sine wave cycle from a Class-D amplifier, embodying the principles of the disclosure. Waveform 810 is the current flowing into the speaker or inductive load from a Class-D amplifier of ±1.6 A. The lower waveforms show the voltage either side of the current sense resistor in 835 and 830, and PWM out of the HV inverter in 840. Negative V2 820 and positive V1 825 show the effect of the disclosure on the inputs to the amplifier. The high frequency PWM 10y swing is significantly attenuated, and the low frequency common mode signal is equal to the peak-to-peak current multiplied by the sense resistance. The circuit is simulated at the transistor level, with PCB parasitics included.

Figure 9:
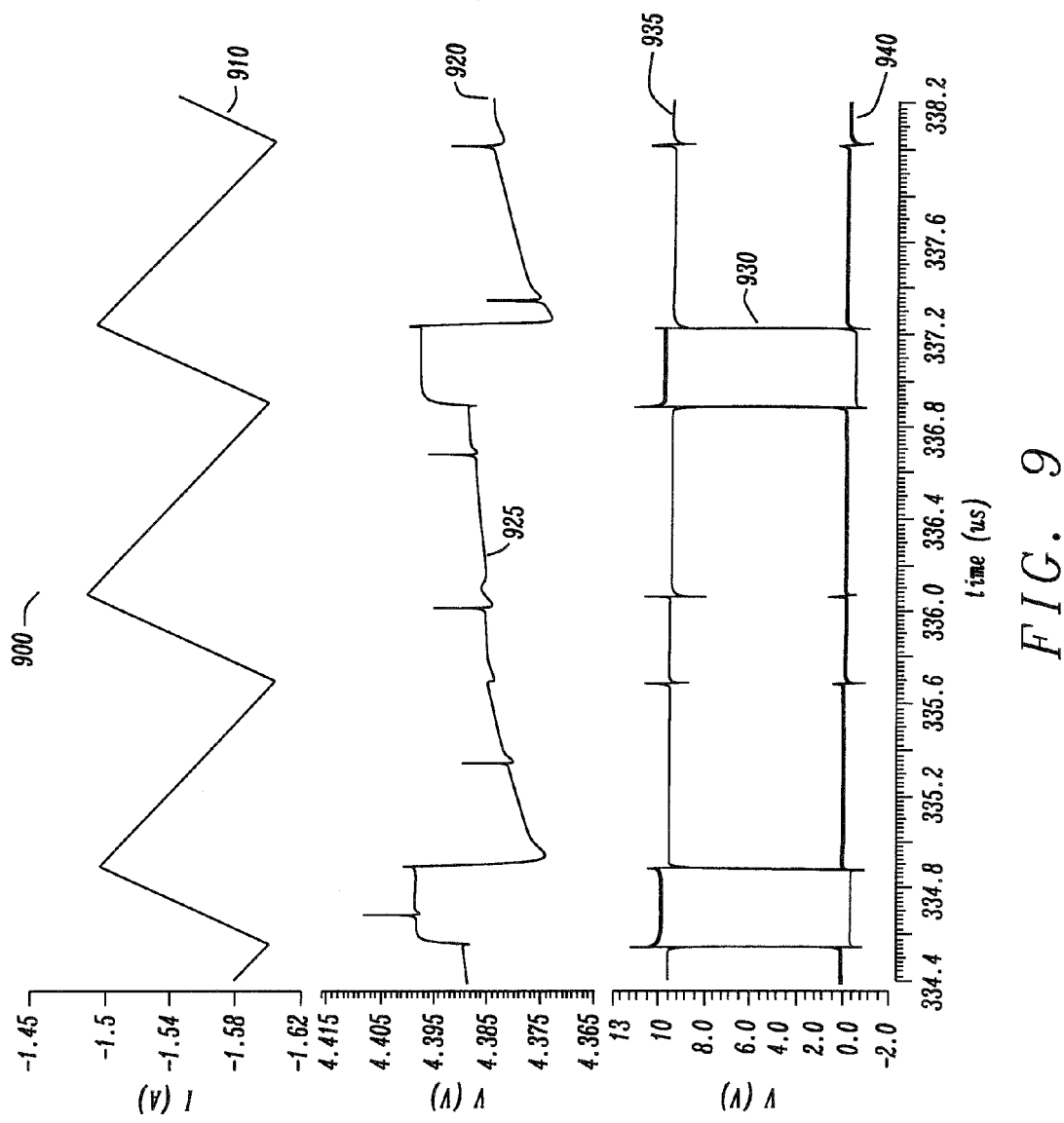
FIG. 9 illustrates the current delivered by the Class-D amplifier, as a result of magnetizing and demagnetizing the inductive load, embodying the principles of the disclosure.

FIG. 9 illustrates current 900 delivered by the audio amplifier, as a result of magnetizing and demagnetizing the inductive load, embodying the principles of the disclosure. It shows the amplifier inputs receive ripple due to the slew rate and delay, between the HV inverter and Class-D output switching. The current shows the speaker output on one side of the H-bridge 940, after the integrated sense resistor 930, and the HV inverter output 935. Also shown are the common mode amplifier inputs, negative V2 920 and positive V1 925, and inductor current 910. The circuit operation is shown over a full sine wave cycle, simulated at the transistor level, with PCB parasitics included.

Figure 10:
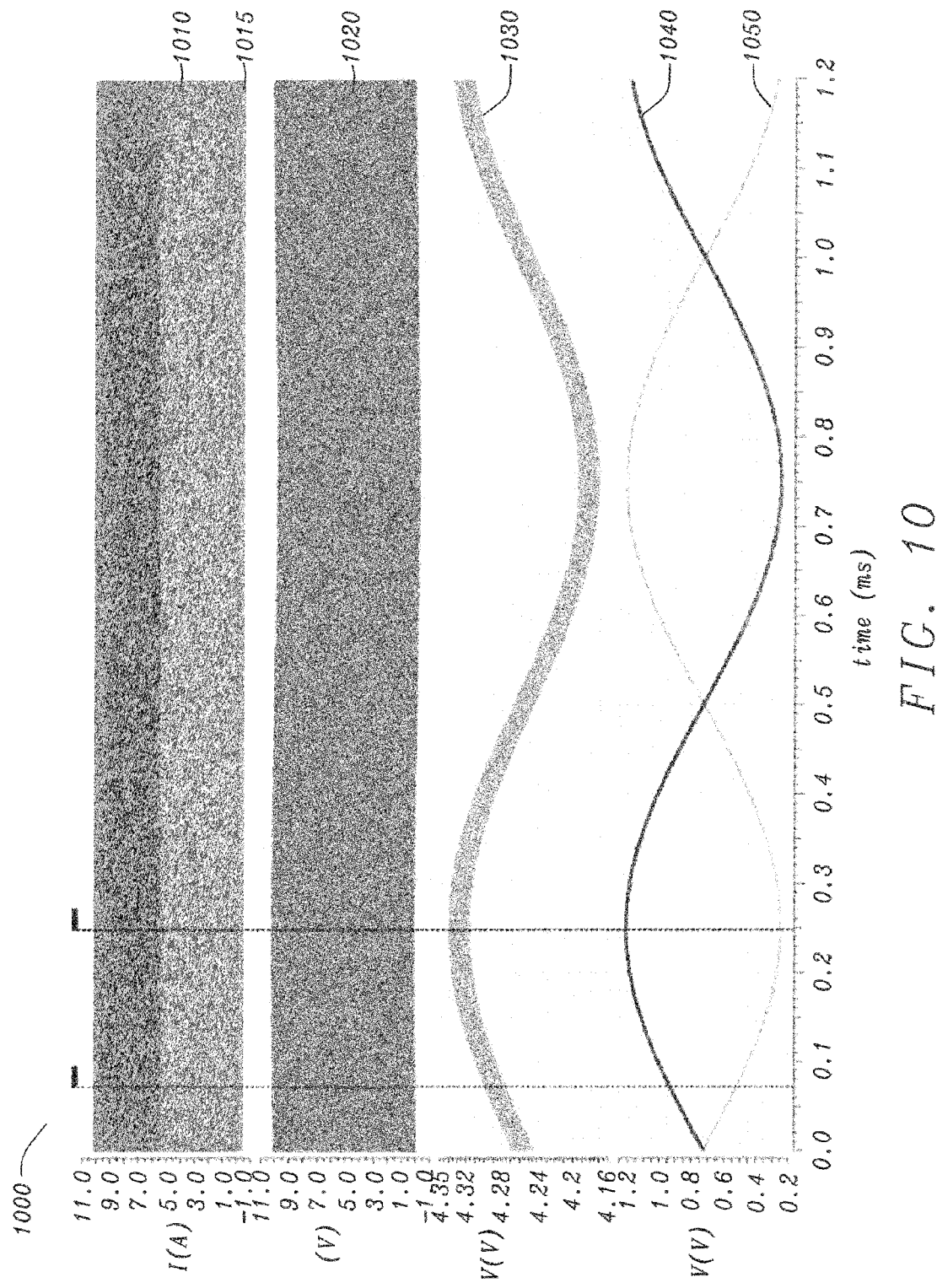
FIG. 10 shows the node voltage for a sine wave through the load impedance, embodying the principles of the disclosure.

FIG. 10 shows node voltage 1000 for a sine wave through the load impedance, embodying the principles of the disclosure. It shows peak-to-peak voltage LA 1010, LA_inverter 1015, and common mode voltage 1020 of the sense resistor. Waveform 1030 is the input to the sensing amplifier, which exhibits a significant reduction in high frequency switching noise, and little attenuation of the low frequency signal itself. Waveforms 1040 and 1045 show the filtered outputs after the HV inverter summing, negative and positive respectively. It is shown that the high frequency common mode is greatly reduced, and the audio band common mode variation dominates. Also the common mode is independent of the pulse-width modulation (PWM) frequency or modulation depth.

Figure 11:
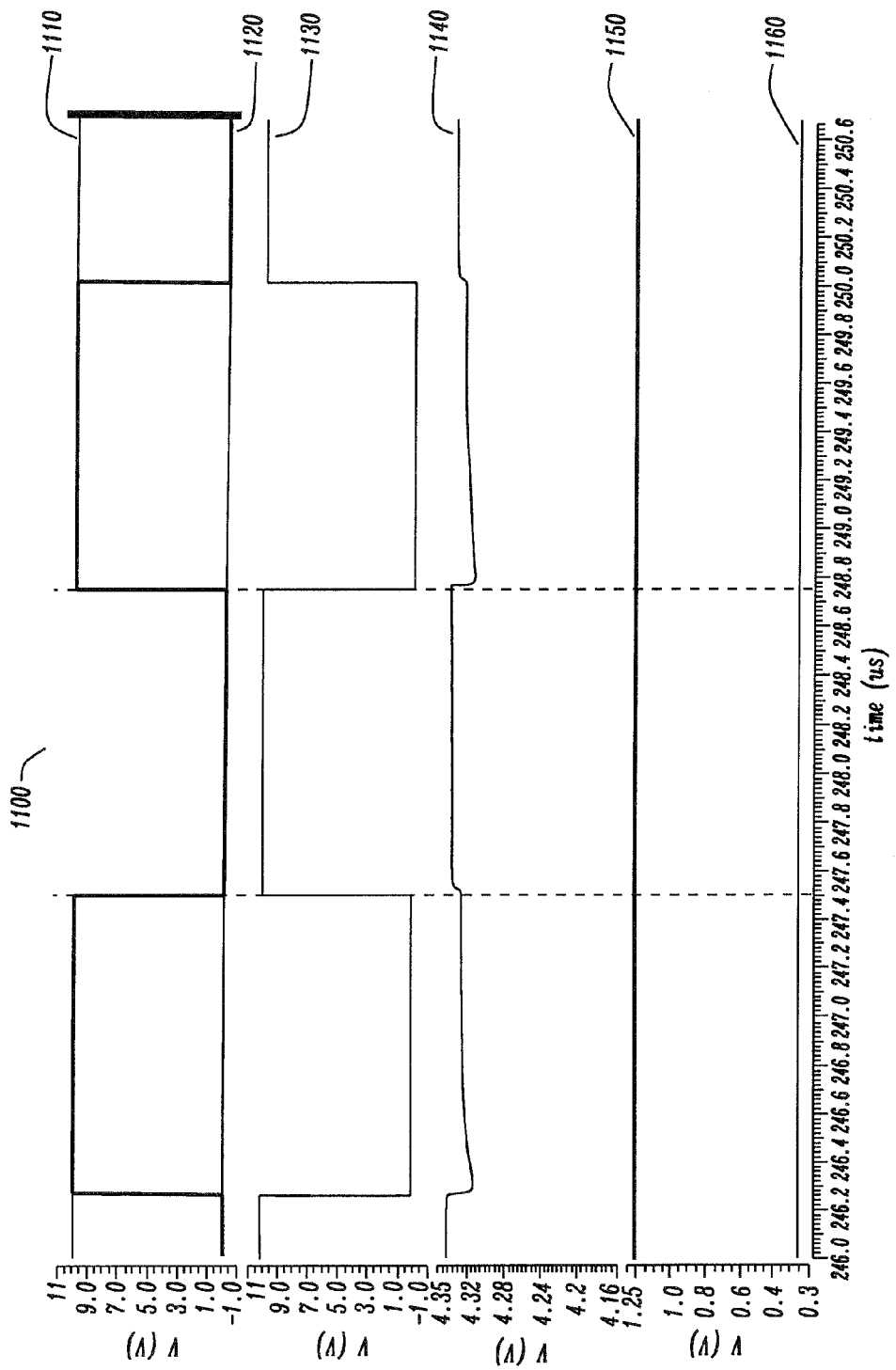
FIG. 11 illustrates the node voltage on the inputs of the amplifier and the common mode voltage before and after the inverter, embodying the principles of the disclosure.

FIG. 11 illustrates node voltage 1100 on the inputs of the amplifier and the common mode voltage before and after the inverter, embodying the principles of the disclosure. Here the waveforms of FIG. 10 are magnified, showing peak-to-peak voltage LA 1110, LA_inverter 1120, and common mode voltage 1130 of the sense resistor. Waveform 1140 is the input to the sensing amplifier, which exhibits a significant reduction in high frequency switching noise, and little attenuation of the low frequency signal itself. Waveforms 1150 and 1160 show the filtered outputs, negative and positive respectively, after the HV inverter summing of the amplifier.

Figure 12:
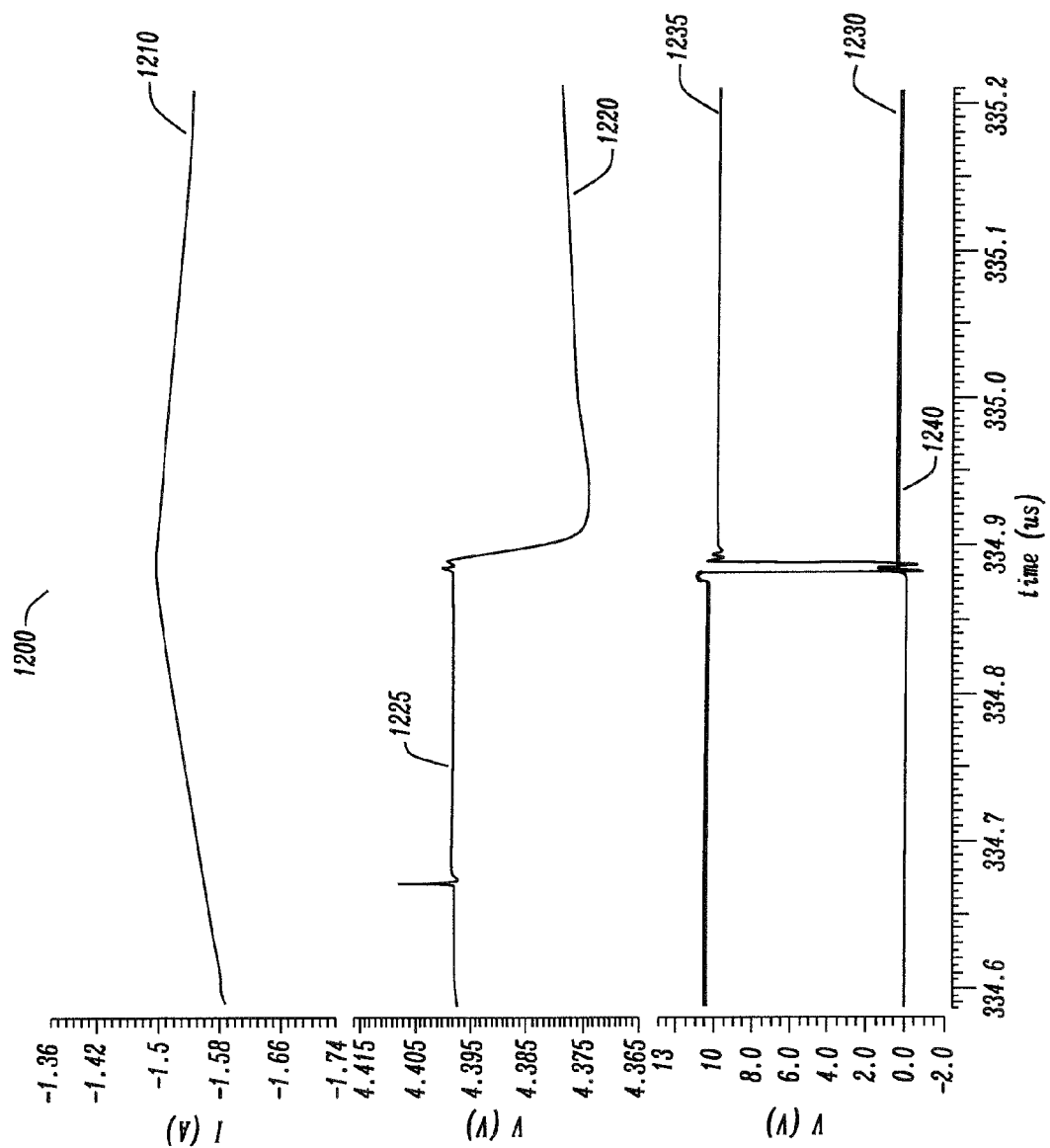
FIG. 12 shows the delay of the high voltage (HV) inverter on the inputs of the amplifier, embodying the principles of the disclosure.

FIG. 12 shows delay 1200 of the high voltage (HV) inverter on the inputs of the amplifier, embodying the principles of the disclosure. In practical implementation, the high frequency common mode cancellation circuit requires at least a first order common mode filter in the form of C1 and Ra, to reduce high frequency ripple produced by the propagation delay of the HV inverter. Inductor current 1210, with respect to the PWM, is shown. The effect of the HV inverter delay on the amplifier inputs, negative V2 1225 and positive V1 1220, is to produce a ripple on the amplifier inputs. The lower waveforms show the voltage either side of the current sense resistor in 1235 and 1230, and the PWM output of the HV inverter 1240.

Figure 13:
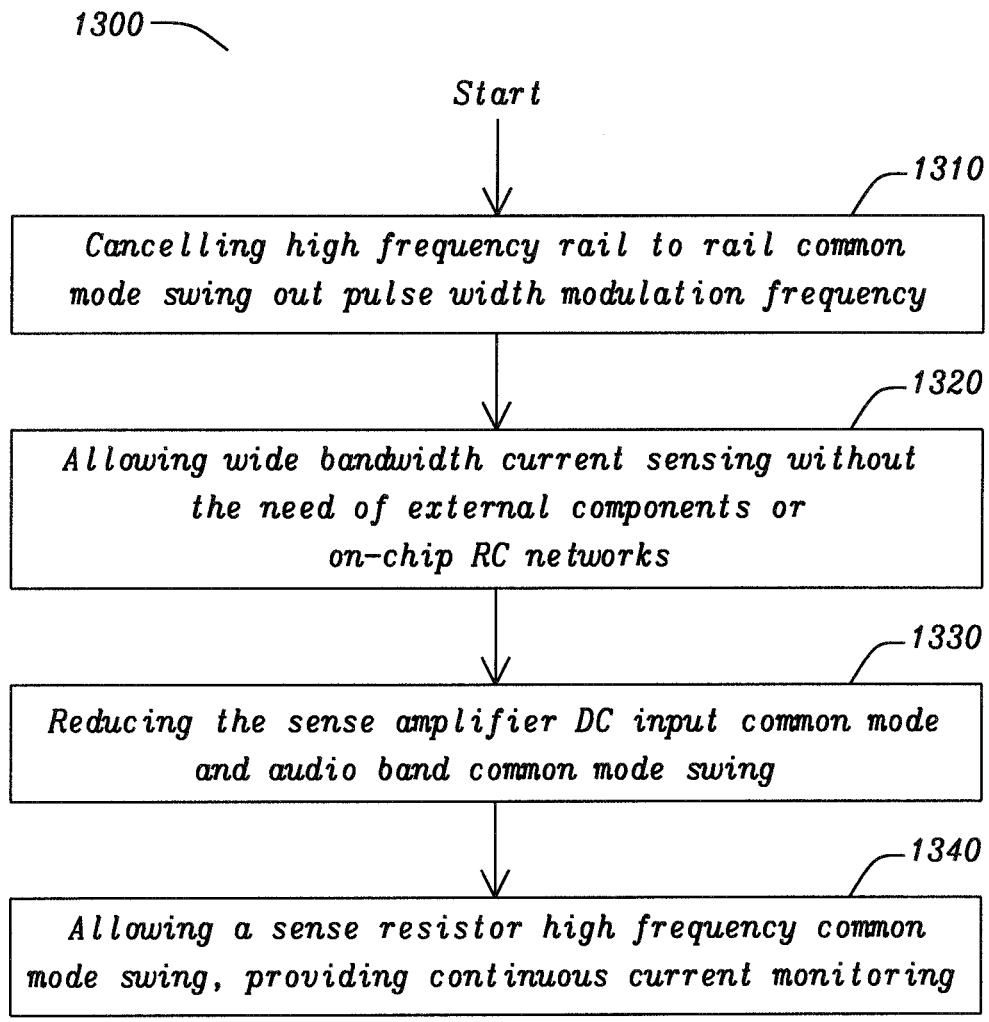
FIG. 13 is flow chart 1300 of a method for high frequency common mode rejection for large common mode signals, embodying the principles of the disclosure.

FIG. 13 is flow chart 1300 of a method for high frequency common mode rejection for large common mode signals, embodying the principles of the disclosure. Step 1310 shows the cancelling of high frequency rail to rail common mode swing at pulse width modulation (PWM) frequency. Step 1320 shows the allowing of wide bandwidth current sensing without the need of external components or large on-chip resistor-capacitor (RC) networks. Step 1330 shows reducing the sense amplifier DC input common mode and audio band common mode swing. Step 1340 shows allowing a sense resistor high frequency common mode swing, providing continuous current monitoring.

The advantages of one or more embodiments of the present disclosure include allowing the current sense input amplifier to operate in continuous mode, as opposed to switched capacitors on a pulse-width modulation (PWM) switched high voltage (HV) signal. The proposal allows for decoupling the operation of the Class-D amplifier and the current sense circuit, as the sense circuitry does not require any feedback from the amplifier. This in turn means easier reuse of the sense circuit independently of the amplifier.

While this invention has been particularly shown and described with reference to the preferred embodiments thereof, it will be understood by those skilled in the art that various changes in form and details may be made without departing from the spirit and scope of the invention.

The invention claimed is:

1. A high frequency common mode rejection circuit for large dynamic common mode signals, comprising:
   a sense resistor, configured in series with a load;
   a summing amplifier configured to sense current through said sense resistor, an output of said summing amplifier comprising said common mode signals;
   a low pass filter between said sense resistor and said summing amplifier; and
   a high voltage (HV) inverter, having a supply voltage of 8 or more volts, having its input connected to said sense resistor on a side of said sense resistor opposite to said load and having its output connected to said low pass filter.

2. The circuit of claim 1, wherein said sense resistor is configured in series with a Class-D, H or G audio amplifier, and wherein said load is an audio speaker.

3. The circuit of claim 1, wherein said sense resistor is configured in series with a Class-D, H or G audio amplifier, and wherein said load is an inductive load.

4. The circuit of claim 1, wherein said sense resistor is configured in series with a linear resonance actuator (LRA) driver, and wherein said load is a linear resonance actuator.

5. The circuit of claim 1, wherein said sense resistor is configured for continuous wide bandwidth current monitoring.

6. The circuit of claim 1, wherein said high voltage inverter is configured to allow a high frequency common mode swing on said summing amplifier.

7. The circuit of claim 1, wherein said high voltage inverter is configured to cancel a swing common mode signal with an anti-phase signal.

8. The circuit of claim 1, wherein said high voltage inverter comprises buffered and delayed control signals, and further comprises a high side and a low side device.

9. The circuit of claim 1, wherein said common mode of said summing amplifier is independent of a pulse-width modulation frequency or modulation depth.

10. The circuit of claim 1, wherein said low pass filter comprises first or second order filtering.

11. The circuit of claim 1, wherein said circuit further comprises a chopper, to reduce the effects of mismatch in resistors at an output of said high voltage inverter.

12. The circuit of claim 8, wherein said high side and low side devices are bipolar transistors.

13. The circuit of claim 1, wherein the common mode behaves like a Class D amplifier output.

14. A method for high frequency common mode rejection for large dynamic common mode signals, comprising the steps of:
    providing a sense resistor, configured in series with a load;
    providing a high voltage (HV) inverter, having a supply voltage of 8 of more volts, having an input of said high voltage inverter connected to said sense resistor on a side of said sense resistor opposite to said load;
    sensing current through said sense resistor, configured to a summing amplifier, an output of said summing amplifier comprising said common mode signals; and
    providing a low pass filter between said sense resistor and said summing amplifier
    cancelling said common mode signals, allowing a high frequency common mode swing on said summing amplifier.

15. The method of claim 14, wherein the sense resistor continuously monitors wide bandwidth current.

16. The method of claim 14, wherein the high voltage inverter reduces audio band common mode.

17. The method of claim 14, wherein the high voltage inverter allows a high frequency common mode swing on the summing amplifier.

18. The method of claim 14, wherein the high voltage inverter cancels a large swing common mode signal with an anti-phase signal.

19. The method of claim 14, wherein the summing amplifier reduces DC input common mode swing.

* * * * *